(12) United States Patent (10) Patent No.: US 9,118,029 B2
Shim et al. (45) Date of Patent: Aug. 25, 2015

(54) ORGANIC LIGHT EMITTING DISPLAY AND METHOD OF MANUFACTURING THE SAME

(71) Applicant: SAMSUNG DISPLAY CO., LTD., Yongin, Gyeonggi-do (KR)

(72) Inventors: Woo Sub Shim, Seoul (KR); Jae Hoon Kim, Cheonan-si (KR); You Min Cha, Asan-si (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 15 days.

(21) Appl. No.: 14/037,060

(22) Filed: Sep. 25, 2013

(65) Prior Publication Data

US 2014/0217372 A1 Aug. 7, 2014

(30) Foreign Application Priority Data

Feb. 6, 2013 (KR) ........................ 10-2013-0013572

(51) Int. Cl.
*H01L 29/08* (2006.01)
*H01L 35/24* (2006.01)
*H01L 51/00* (2006.01)
*H01L 51/50* (2006.01)
*H01L 27/32* (2006.01)

(52) U.S. Cl.
CPC ........ *H01L 51/5012* (2013.01); *H01L 27/3246* (2013.01); *H01L 27/3211* (2013.01); *H01L 2251/558* (2013.01)

(58) Field of Classification Search
USPC ................ 257/40, 88, 99, 943–643, E33.059, 257/E21.503, E51.001–E51.052, 257/E25.008–E25.009, 223, 227, 291, 292, 257/439, 443, 655, E27.1, E27.125, 257/E27.112, E29.117, E29.145, E29.147, 257/E29.151, E29.182, E29.202, 257/E29.273–E29.299, E29.314, E29.32, 257/E23.016; 438/27, 28, 35
See application file for complete search history.

(56) References Cited

U.S. PATENT DOCUMENTS

| | | | |
|---|---|---|---|
| 2007/0182795 A1 | 8/2007 | Kim et al. | |
| 2009/0153033 A1 | 6/2009 | Lee et al. | |
| 2010/0019235 A1 | 1/2010 | Iizumi et al. | |
| 2012/0007067 A1* | 1/2012 | Kaneta et al. | 257/40 |
| 2012/0135556 A1* | 5/2012 | Takeuchi | 438/34 |
| 2012/0326139 A1* | 12/2012 | Chen | 257/40 |
| 2013/0146903 A1* | 6/2013 | Ichikawa et al. | 257/88 |
| 2013/0234126 A1* | 9/2013 | Nakatani | 257/40 |
| 2013/0299813 A1* | 11/2013 | Akamatsu et al. | 257/40 |
| 2014/0175399 A1* | 6/2014 | Choi et al. | 257/40 |

FOREIGN PATENT DOCUMENTS

| | | |
|---|---|---|
| KR | 10-0724157 B1 | 6/2007 |
| KR | 10-2007-0079864 A | 8/2007 |
| KR | 10-2009-0062088 A | 6/2009 |
| KR | 10-2009-0101233 A | 9/2009 |

* cited by examiner

*Primary Examiner* — Dao H Nguyen
*Assistant Examiner* — Tram H Nguyen
(74) *Attorney, Agent, or Firm* — Robert E. Bushnell, Esq.

(57) ABSTRACT

An organic light emitting display includes a substrate, a first electrode disposed on the substrate, a pixel definition layer disposed on the substrate to partition a pixel area, a first common layer disposed on the first electrode, a protrusion pattern that includes a plurality of protrusions disposed on the first common layer and spaced apart from each other, a light emitting layer disposed on the first common layer in the pixel area, and a second electrode disposed on the light emitting layer.

20 Claims, 9 Drawing Sheets

ORGANIC LIGHT EMITTING DISPLAY AND METHOD OF MANUFACTURING THE SAME

CLAIM OF PRIORITY

This application makes reference to, incorporates the same herein, and claims all benefits accruing under 35 U.S.C. §119 from an application for ORGANIC LIGHT EMITTING DISPLAY AND METHOD OF MANUFACTURING THE SAME, earlier filed in the Korean Intellectual Property Office on Feb. 6, 2013 and there duly assigned Serial No. 10-2013-0013572.

BACKGROUND OF THE INVENTION

1. Field of the Invention

The present invention relates to an organic light emitting display and a method of manufacturing the same. More particularly, the present invention relates to an organic light emitting display uniformity of images and a method of manufacturing the organic light emitting display.

2. Description of the Related Art

A flat panel display device is classified into a light emitting type display device and a light receiving type display device. As the light emitting type display device, a flat cathode ray tube, a plasma display panel, and an electroluminescent display device are used. A liquid crystal display is used as the light receiving type display device. Among them, the electroluminescent display has been spotlighted as a next generation display device since it has various properties, e.g., wide viewing angle, superior contrast, fast response speed, etc. The electroluminescent display device is classified into an inorganic electroluminescent display device and an organic electroluminescent display device according to a material used to form a light emitting layer.

The organic electroluminescent display device is a self-emissive display device that electrically excites a fluorescence organic compound to emit light, and thus the organic electroluminescent display device has been spotlighted as a next generation display device since it has various properties, e.g., low driving voltage, thin thickness, wide viewing angle, fast response speed, etc., when compared to the liquid crystal display.

The organic electroluminescent display device includes an anode electrode, a cathode electrode, and a light emitting layer formed of an organic material. When positive and negative voltages are applied to the anode and cathode electrodes, holes injected from the anode electrode are transported to the light emitting layer through a hole transport layer and electrons injected from the cathode electrode are transported to the light emitting layer through an electron transport layer. Then, the holes are recombined with the electrons in the light emitting layer to generate exciton. The exciton emits energy discharged when an excited state returns to a ground state as light.

SUMMARY OF THE INVENTION

The present invention provides an organic light emitting display capable of improving dark spots.

The present invention provides a method of manufacturing the organic light emitting display.

Embodiments of the invention provide an organic light emitting display including a substrate, a first electrode disposed on the substrate, a pixel definition layer disposed on the substrate to partition a pixel area, a first common layer disposed on the first electrode, a protrusion pattern that includes a plurality of protrusions disposed on the first common layer and spaced apart from each other, a light emitting layer disposed on the first common layer in the pixel area, and a second electrode disposed on the light emitting layer.

The organic light emitting display further includes a second common layer disposed between the first common layer and the light emitting layer. In this case, the first common layer is a hole injection layer and the second common layer is a hole transport layer.

The organic light emitting display further includes a second common layer disposed between the first electrode and the first common layer. In this case, the first common layer is a hole transport layer and the second common layer is a hole injection layer.

The pixel area is provided in a plural number, each of the pixel areas is a red pixel area, a green pixel area, or a blue pixel area, and the light emitting layer emits a red light, a green light, and a blue light in the red pixel area, the green pixel area, and the blue pixel area, respectively. The protrusion pattern provided in the red, green, and blue pixel areas has different shapes or different densities.

Embodiments of the invention provide a method of manufacturing an organic light emitting display. The organic light emitting display is manufactured by forming a first electrode on a substrate, forming a pixel definition layer on the first electrode to define a pixel area, forming a first common layer on the first electrode, forming a protrusion pattern including a plurality of protrusions spaced apart from each other on the first common layer, forming a light emitting layer on the first common layer in the pixel area, and forming a second electrode on the light emitting layer.

The light emitting layer is formed by an inkjet.

The protrusion pattern is formed by forming a photosensitive organic layer on the first common layer and selectively irradiating a light onto the photosensitive organic layer using a mask to form the protrusion pattern.

According to the above, since the light emitting layer is formed to have uniform thickness in the whole area of the pixel areas, the dark spots are prevented or reduced. As a result, the uniformity of the image displayed in each pixel is improved, so that a life span of each pixel is extended. In addition, colors may be prevented from being mixed between the pixels adjacent to each other.

BRIEF DESCRIPTION OF THE DRAWINGS

The above and other advantages of the present invention will become readily apparent by reference to the following detailed description when considered in conjunction with the accompanying drawings wherein.

DETAILED DESCRIPTION OF THE INVENTION

Figure 1:
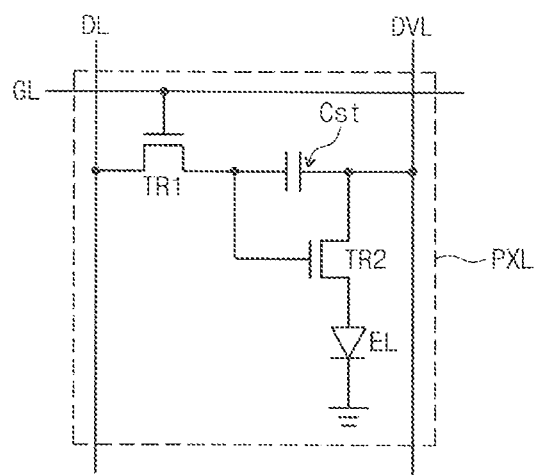
FIG. 1 is a circuit diagram showing an organic light emitting display according to an exemplary embodiment of the present invention.

It will be understood that when an element or layer is referred to as being "on", "connected to" or "coupled to"

another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be explained in detail with reference to the accompanying drawings.

Figure 2:
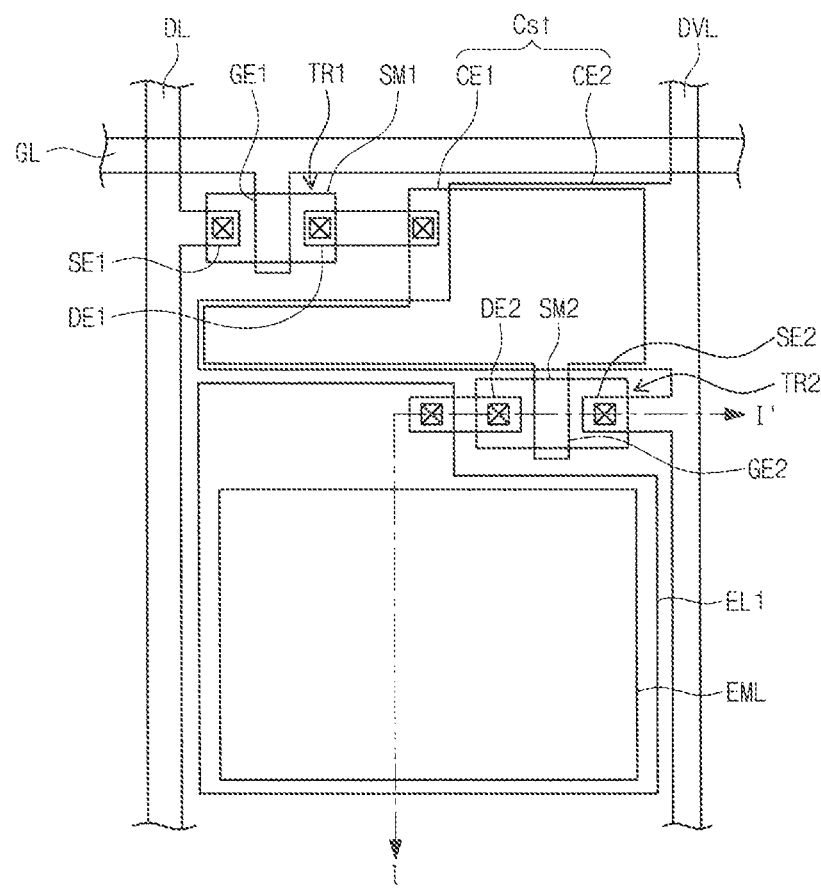
FIG. 2 is a plan view showing a pixel shown in FIG. 1.
Figure 3:
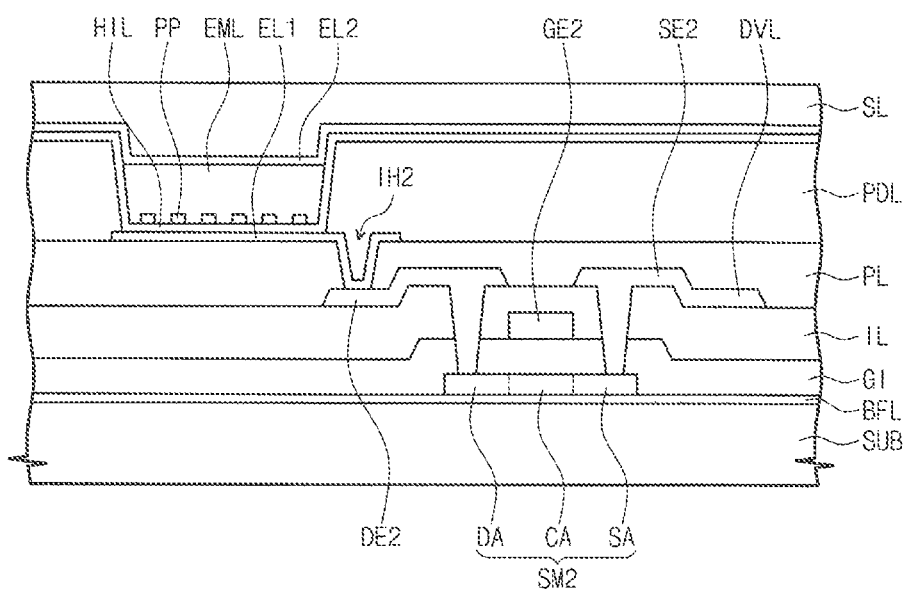
FIG. 3 is a cross-sectional view taken along a line I-I' of FIG. 2.
Figure 4:
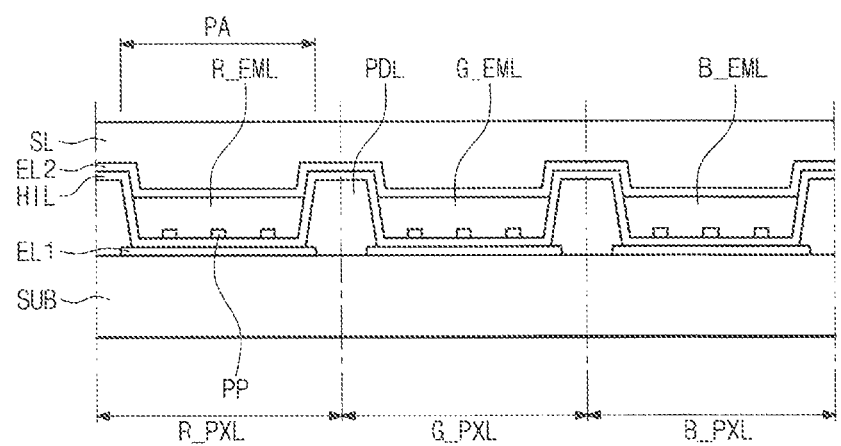
FIG. 4 is a cross-sectional view showing a substrate, a pixel definition layer, and a pixel shown in FIG. 3.

FIG. 1 is a circuit diagram showing an organic light emitting display according to an exemplary embodiment of the present invention, FIG. 2 is a plan view showing a pixel shown in FIG. 1, FIG. 3 is a cross-sectional view taken along a line I-I' of FIG. 2, and FIG. 4 is a cross-sectional view showing a substrate, a pixel definition layer, and a pixel shown in FIG. 3.

The organic light emitting display according to the present exemplary embodiment includes at least one pixel PXL to display an image. The pixel PXL is provided in a plural number and the pixels PXL are arranged in a matrix form. Here, each pixel PXL has a rectangular shape, but it should not be limited to the rectangular shape. In addition, the pixels PXL may have different areas. For instance, the pixels PXL may have different areas or different shapes according to their colors.

The pixel PXL includes a line part configured to include a gate line GL, a data line DL, and a driving voltage line DVL, a thin film transistor connected to the line part, an organic light emitting device EL connected to the thin film transistor, and a capacitor Cst.

The gate line GL is extended in a predetermined direction and the data line DL is extended in a direction different from the direction in which the gate line GL is extended. The driving voltage line DVL is extended in the same direction as the data line DL. The gate line GL applies a scan line to the thin film transistor, the data line DL applies a data signal to the thin film transistor, and the driving voltage line DVL applies a driving voltage to the thin film transistor.

The thin film transistor includes a driving thin film transistor TR2 to control the organic light emitting device EL and a switching thin film transistor TR1 to switch the driving thin film transistor TR2. In the present exemplary embodiment, one pixel PXL includes two thin film transistors TR1 and TR2, but it should not be limited thereto or thereby. That is, one pixel PXL includes a thin film transistor and a capacitor, or at least three thin film transistors and at least two capacitors.

The switching thin film transistor TR1 includes a first gate electrode GE1, a first source electrode SE1, and a first drain electrode DE1. The first gate electrode GE1 is connected to the gate line GL and the first source electrode SE1 is connected to the data line DL. The first drain electrode DE1 is connected to a gate electrode of the driving thin film transistor TR2, e.g., a second gate electrode GE2. The switching thin film transistor TR1 applies the data signal provided through the data line DL to the driving thin film transistor TR2 in response to the scan signal provided through the gate line GL.

The driving thin film transistor TR2 includes the second gate electrode GE2, a second source electrode SE, and a second drain electrode DE2. The second gate electrode GE2 is connected to the switching thin film transistor TR1, the second source electrode SE2 is connected to the driving voltage line DVL, and the second drain electrode DE2 is connected to the organic light emitting device EL.

The organic light emitting device EL includes a light emitting layer EML, a first electrode EL1, and a second electrode EL2 facing the first electrode EL1 while interposing the light emitting layer EML between the first and second electrodes EL1 and EL2. The first electrode EL1 is connected to the second drain electrode DE2 of the driving thin film transistor TR2. The second electrode EL2 is applied with a common voltage and the light emitting layer EML emits a light in accordance with an output signal of the driving thin film transistor TR2, thereby displaying a desired image.

The capacitor Cst is connected between the second gate electrode GE2 and the second source electrode SE2 of the driving thin film transistor TR2 and charged with the data signal input to the second gate electrode GE2 of the driving thin film transistor TR2.

Hereinafter, the organic light emitting display will be described in accordance with the stack order of elements of the organic light emitting display.

The organic light emitting display includes an insulating substrate SUB formed of glass, plastic, or crystal, on which the thin film transistor and the organic light emitting device are disposed.

A buffer layer BFL is disposed on the substrate SUB. The buffer layer BFL prevents impurities from being diffused to the switching and driving thin film transistors TR1 and TR2. The buffer layer BFL may include silicon nitride ($SiN_x$), silicon oxide (SiOx), silicon oxide nitride (SiOxNy), and be omitted in accordance with a material of the substrate SUB and a process condition.

A first semiconductor layer SM1 and a second semiconductor layer SM2 are disposed on the buffer layer BFL. The first and second semiconductor layers SM1 and SM2 are formed of a semiconductor material, and serve as active layers of the switching thin film transistor TR1 and the driving thin film transistor TR2, respectively. Each of the first and second semiconductor layers SM1 and SM2 includes a source area SA, a drain area DA, and a channel area CA disposed between the source area SA and the drain area DA. The first and second semiconductor layers SM1 and SM2 are formed of an inorganic semiconductor material or an organic semiconductor material. The source area SA and the drain area DA are doped with an n- or p-type impurity.

A gate insulating layer GI is disposed on the first and second semiconductor layers SM1 and SM2.

A first gate electrode GE1 and a second gate electrode GE2, which are connected to the gate line GL, are disposed on the gate insulating layer GI. The first gate electrode GE1 and the second gate electrode GE2 are formed to cover an area corresponding to the channel area CA of the first semiconductor layer SM1 and the second semiconductor layer SM2, respectively.

An inter-insulating layer IL is disposed on the first and second gate electrodes GE1 and GE2 to cover the first and second gate electrodes GE1 and GE2.

The first source electrode SE1, the first drain electrode DE1, the second source electrode SE2, and the second drain electrode DE2 are disposed on the inter-insulating layer IL. The first source electrode SE1 and the first drain electrode DE1 respectively make contact with the source area SA and the drain area DA of the first semiconductor layer SM1 through contact holes formed through the gate insulating layer GI and the inter-insulating layer IL. The second source electrode SE2 and the second drain electrode DE2 respectively make contact with the source area SA and the drain area DA of the second semiconductor layer SM2 through contact holes formed through the gate insulating layer GI and the inter-insulating layer IL.

Meanwhile, a portion of the second gate electrode GE2 and a portion of the driving voltage line DVL respectively correspond to a first capacitor electrode CE1 and a second capacitor electrode CE2 to form the capacitor Cst in cooperation with the inter-insulating layer IL disposed between the portions of the second gate electrode GE2 and the driving voltage line DVL.

A passivation layer PL is disposed on the first source electrode SE1, the first drain electrode DE1, the second source electrode SE2, and the second drain electrode DE2. The passivation layer PL protects the switching and driving thin film transistors TR1 and TR2, and the passivation layer PL serves as a planarization layer to planarize the switching and driving thin film transistors TR1 and TR2.

The first electrode EL1 is disposed on the passivation layer PL as an anode of the organic light emitting device EL. The first electrode EL1 is connected to the second drain electrode DE2 of the driving thin film transistor TR2 through a contact hole formed through the passivation layer PL. The first electrode EL1 may serve as a cathode, however, in the present exemplary embodiment, the first electrode EL1 will be described as the anode.

The first electrode EL1 may be formed of a material having a higher work function. In a case that an image is provided to a lower direction of the substrate SUB, the first electrode EL1 may be formed of a transparent conductive layer, such as indium tin oxide (ITO), indium zinc oxide (IZO), zinc oxide (ZnO), indium tin zinc oxide (ITZO), etc. In a case that the image is provided to an upper direction of the substrate SUB, the first electrode EL1 may be formed of a metal reflective layer, e.g., Ag, Mg, Al, Pt, Pd, Au, Ni, Nd, Ir, Cr, etc., and the transparent conductive layer, e.g., ITO, IZO, ZnO, ITZO, etc.

A pixel definition layer PDL is disposed on the substrate SUB, on which the first electrode EL1 is formed, to partition a pixel area PA into plural areas respectively corresponding to the pixels PXL. The pixel definition layer PDL is protruded from the substrate SUB along the circumference of the pixel to expose an upper surface of the first electrode EL1.

The light emitting layer EML is disposed in the pixel area PA surrounded by the pixel definition layer PDL, and the second electrode EL2 is disposed on the light emitting layer EML.

Here, a lower common layer is disposed between the first electrode EL1 and the light emitting layer EML and an upper common layer is disposed between the light emitting layer EML and the second electrode EL2. The lower common layer and the upper common layer serve as a carrier transport layer and are applied to each pixel. The lower common layer includes a hole injection layer HIL and a hole transport layer HTL and the upper common layer includes an electron injection layer EIL and an electron transport layer ETL. In the case that the first electrode EL1 is the anode, the lower common layer, the upper common layer, and the light emitting layer EML are stacked on the first electrode EL1 in order of the hole injection layer HIL, the hole transport layer HTL, the light emitting layer EML, the electron transport layer ETL, the electron injection layer EIL, and the second electrode.

In the present exemplary embodiment, at least one layer of the hole injection layer HIL, the hole transport layer HTL, the electron transport layer ETL, or the electron injection layer EIL depends on the material and the light-emitting property of the light emitting layer EML. Here, the case that the hole injection layer HIL of the lower common layer is prepared will be described as a representative example.

The hole injection layer HIL includes a conductive polymer including a metal complex. The hole injection layer HIL may include a phthalocyanine compound of copperphthalocyanine, m-MTDATA [4,4',4''-tris (3-methylphenylphenylamino) triphenylamine], NPB(N,N'-di(1-naphthyl)-N,N'-diphenylbenzidine), TDATA, 2-TNATA, Pani/DBSA (polyaniline/dodecylbenzenesulfonic acid), PEDOT/PSS (Poly(3,4-ethylenedioxythiophene/Poly(4-styrenesulfonate), Pani/CSA(Polyaniline/Camphor sulfonicacid), or PANI/PSS(Polyaniline)/Poly(4-styrenesulfonate), but it should not be limited thereto or thereby.

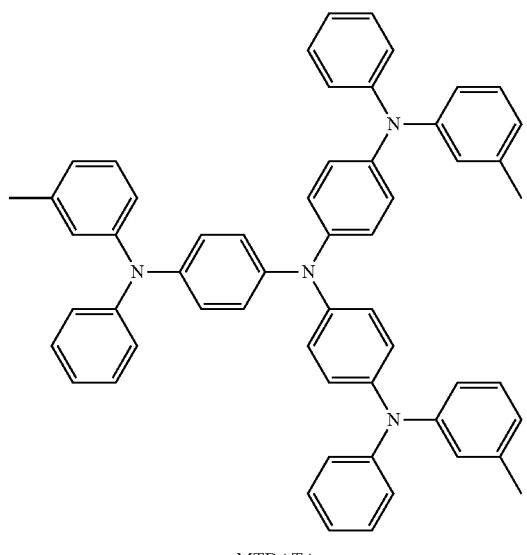

m-MTDATA

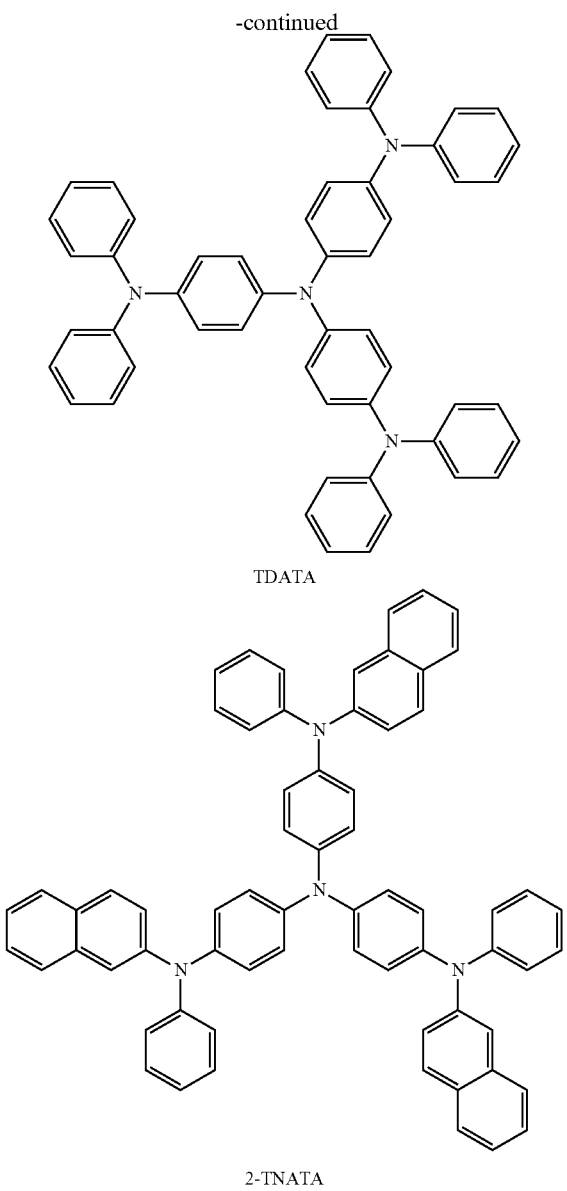

TDATA

2-TNATA

A protrusion pattern PP is disposed on the hole injection layer HIL. The protrusion pattern PP includes a plurality of protrusions formed on the hole injection layer HIL and spaced apart from each other. The protrusions have a column shape protruded from an upper surface of the hole injection layer HIL, but it should not be limited thereto or thereby. When viewed in a plan view, each protrusion has various shapes, e.g., a circular shape, an oval shape, a polygonal shape like a rectangular shape, etc.

The protrusion pattern PP includes an organic polymer and has the same or similar surface energy as the surface energy of the light emitting layer EML. In this case, the light emitting layer EML has an affinity to the surface of the protrusion pattern PP, and thus the light emitting layer EML is uniformly dispersed by the protrusion pattern PP.

The protrusions are arranged in one pixel area PA to be spaced apart from each other with regular intervals. This is to allow the light emitting layer EML to have a uniform thickness in the pixel area PA.

According to another embodiment, the protrusions are arranged in one pixel area PA to be spaced apart from each other with different intervals. For instance, the number of the protrusions per area in an area located closer to the pixel definition layer PDL is different from the number of the protrusions per area in an area located far away from the pixel definition layer PDL, and the number of the protrusions per area in an area located closer to the pixel definition layer PDL is smaller than the number of the protrusions per area in an area located far away from the pixel definition layer PDL. Thus, when the light emitting layer EML is formed, the light emitting layer EML may be prevented from being increased in thickness due to the overlap between the light emitting layer EML and the pixel definition layer PDL in the area located closer to the pixel definition layer PDL.

The light emitting layer EML may include a light emitting material emitting a red, green, or blue color corresponding to each pixel. Pixels each emitting the red, green, or blue colors are operated as red, green, and blue color pixels R_PXL, G_PXL, and B_PXL corresponding to red, green, and blue pixel areas, respectively. The red, green, and blue color pixels R_PXL, G_PXL, and B_PXL form one main pixel. However, the color of the emitted light in each pixel, i.e., an emitting wavelength, should not be limited thereto or thereby. The pixels may emit additional colors, such as yellow and magenta colors, or one pixel may emit a white light.

The light emitting layer EML may be formed of various light emitting materials including a host and a dopant. As the dopant, a fluorescent dopant and a phosphorescent dopant may be used. As the host, for example, Alq3C CBP(4,4'-N, N'-dicarbazole-biphenyl), 9,10-di(naphthalen-2-yl)anthracen(ADN), or DSA (distyrylarylene) may be used, however, it should not be limited thereto or thereby.

Meanwhile, as a red color dopant, PtOEP, Ir(piq)3, Btp2Ir (acac), or DCJTB may be used, but it should not be limited thereto or thereby.

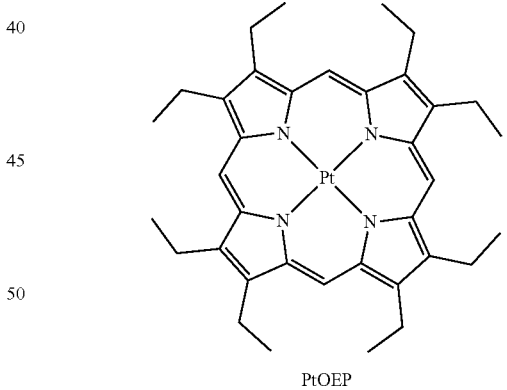

PtOEP

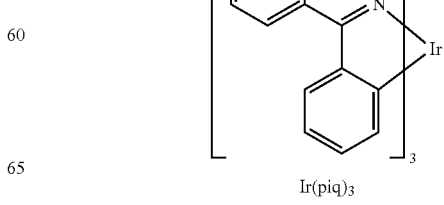

Ir(piq)$_3$

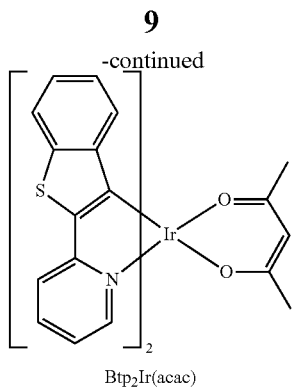

Btp₂Ir(acac)

As a green color dopant, Ir(ppy)3 (ppy=phenylpyridine), Ir(ppy)2(acac), or Ir(mpyp)3C C545T may be used, but it should not be limited thereto or thereby.

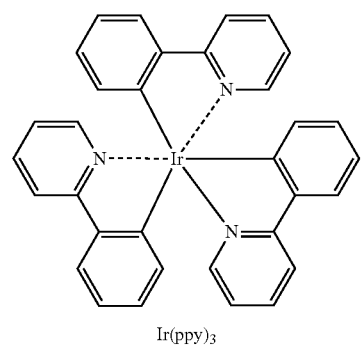

Ir(ppy)₃

Ir(ppy)₂(acac)

Ir(mpyp)₃

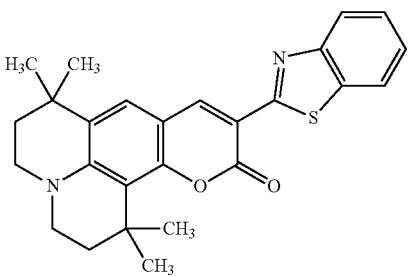

C545T

As a blue color dopant, F2Irpic, (F2 ppy)2Ir(tmd), Ir(df-ppz)3, ter-fluorene, 4,4'-bis(4-diphenylaminostaryl) biphenyl (DPAVBi), or 2,5,8,11-tetra-t-butyl perylene (TBP) may be used, but it should not be limited thereto or thereby.

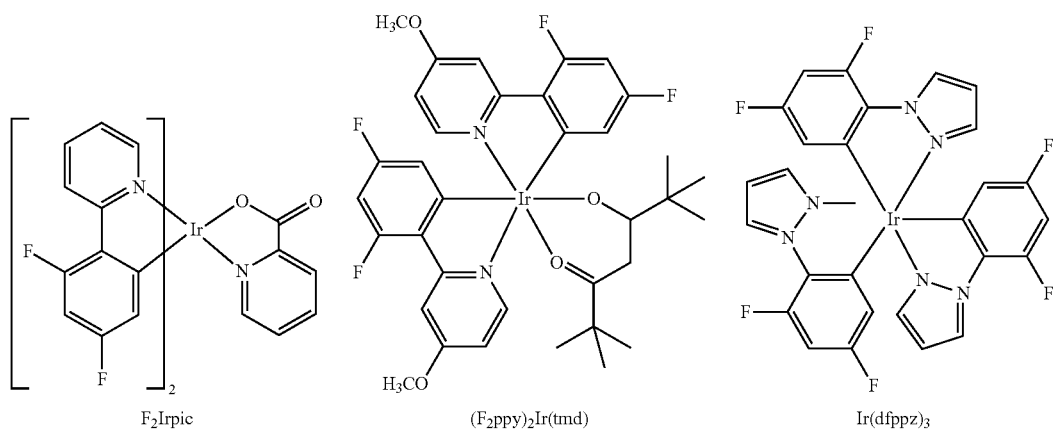

F₂Irpic       (F₂ppy)₂Ir(tmd)       Ir(dfppz)₃

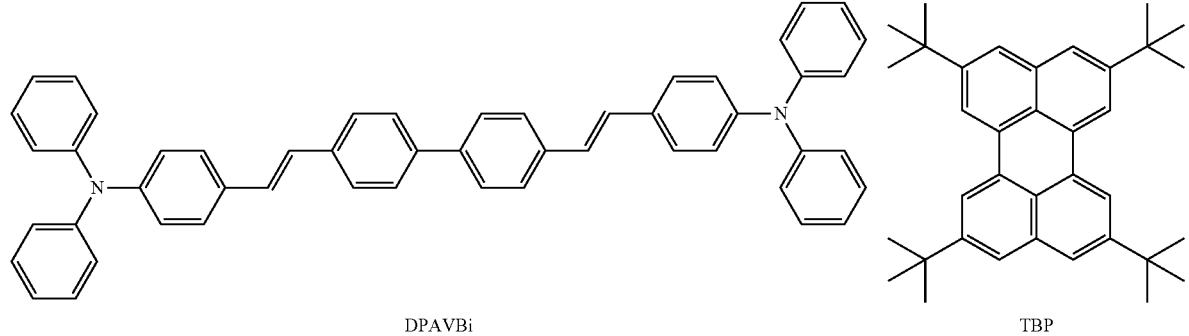

DPAVBi
TBP

Although not shown in figures, in the case that the light emitting layer EML includes a phosphorescent dopant, a hole blocking layer may be disposed on the light emitting layer EML to prevent a triplet exciton or the hole from being diffused to the electron transport layer ETL.

The second electrode EL2 includes a material having a lower work function, such as metal, alloy, electric conductive compound, and a mixture thereof. For example, the second electrode EL2 includes lithium (Li), magnesium (Mg), aluminum (Al), aluminum-lithium (Al—Li), calcium (Ca), magnesium-indium (Mg—In), magnesium-silver (Mg—Ag), etc.

Meanwhile, the second electrode EL2 may be a transmissive or reflective electrode. When the second electrode EL2 is the transmissive electrode, the second electrode EL2 includes the above-mentioned transparent conductive material. When the second electrode EL2 is the reflective electrode, the second electrode EL2 includes a metal reflective layer.

A sealant layer SL is disposed on the second electrode EL2 to cover the second electrode EL2.

Hereinafter, a method of manufacturing the organic light emitting display according to an exemplary embodiment of the present invention will be described in detail with reference to FIGS. 5A to 5E. FIGS. 5A to 5E are cross-sectional views showing a method of manufacturing an organic light emitting display according to an exemplary embodiment of the present invention. For the convenience of explanation, a portion of elements of the organic light emitting display, e.g., the thin film transistor, has been omitted in FIGS. 5A to 5E, and the substrate SUB, the pixel definition layer PDL, and the pixel will be mainly described.

Figure 5A:
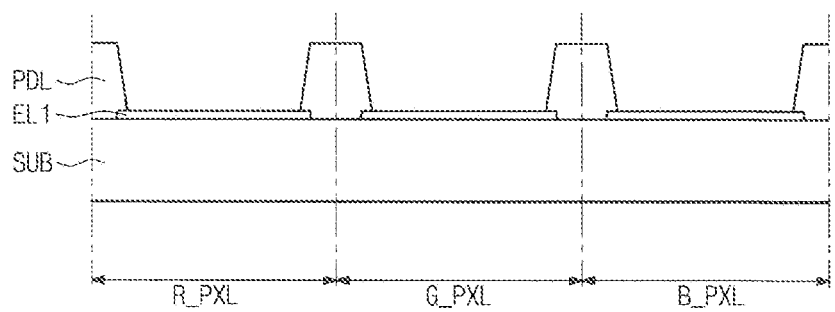
FIGS. 5A to 5E are cross-sectional views showing a method of manufacturing an organic light emitting display according to an exemplary embodiment of the present invention.

Referring to FIG. 5A, the line part (not shown), the thin film transistor (not shown), the first electrode EL1, and the pixel definition layer PDL are formed on the substrate SUB. The line part and the thin film transistor are formed by a photolithography process using a mask. The first electrode EL1 is formed by depositing a conductive material on the substrate SUB on which the line part and the thin film transistor are formed and patterning the conductive material using a photolithography process.

The pixel definition layer PDL is formed by forming a photosensitive organic layer on the substrate SUB on which the first electrode EL1 is formed, patterning the photosensitive organic layer by a photolithography using a mask, and curing the patterned photosensitive organic layer.

Figure 5B:
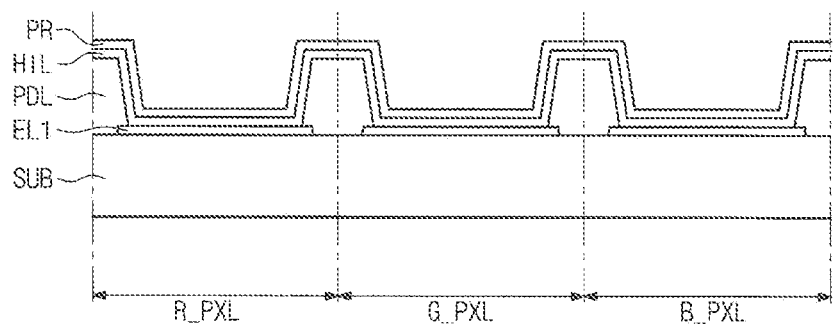

Referring to FIG. 5B, the hole injection layer HIL is formed on the substrate SUB on which the first electrode EL1 and the pixel definition layer PDL are formed. The hole injection layer HIL may be formed by various methods, e.g., a slit coating method, a printing method, a vacuum deposition method, a spin coating method, a casting method, an LB method, etc. A photosensitive organic layer PR is formed on the hole injection layer HIL to form the protrusion pattern PP. The photosensitive organic layer PR may be a precursor to induce an optical chemical reaction or a catalyst reaction due to an exposure. The photosensitive organic layer PR may be formed by various methods, e.g., a slit coating method, a spin coating method, a printing method, etc.

Figure 5C:
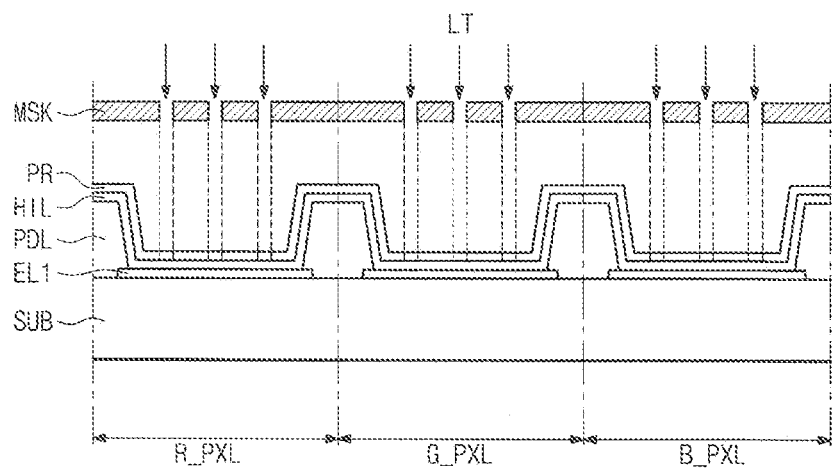

Referring to FIG. 5C, the photosensitive organic layer PR is exposed to a light LT through a mask MSK. The light LT irradiated onto the photosensitive organic layer PR is an ultraviolet light, and the optical chemical reaction or the catalyst reaction occurs in the photosensitive organic layer PR by the light LT, thereby forming the protrusion pattern PP.

Figure 5D:
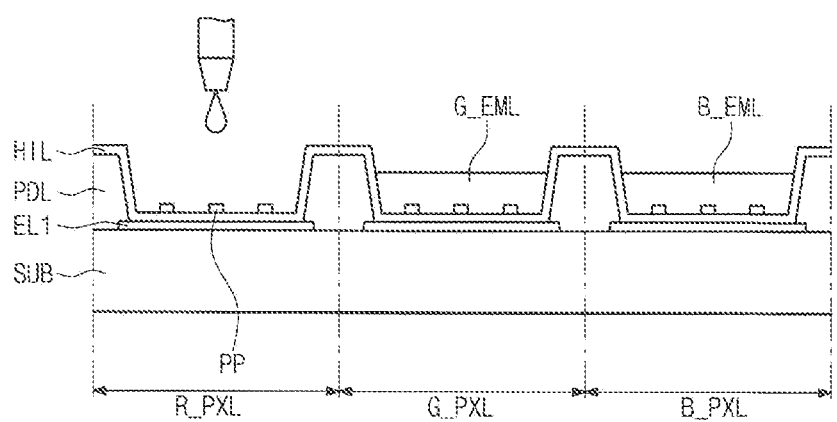

Referring to FIG. 5D, the light emitting layer EML is formed on the substrate SUB on which the protrusion pattern PP is formed. The light emitting layer EML is provided in a fluid form and formed by removing solvent later. The light emitting layer EML is formed on the substrate SUB using a printing method. The printing method includes an inkjet method and a coating method utilizing a nozzle. In FIG. 5D, the light emitting layer EML is formed by the inkjet method. The light emitting layer EML is provided in a fluid form in the pixel area PA surrounded by the pixel definition layer PDL and uniformly dispersed in the pixel area PA by the protrusion pattern PP.

Here, although a relatively large amount of the organic light emitting material for the light emitting layer EML is provided in a specific pixel area, the organic light emitting material may be prevented from overflowing to the other pixel areas since the protrusion pattern PP blocks the movement of the organic light emitting material for the light emitting layer EML.

Figure 5E:
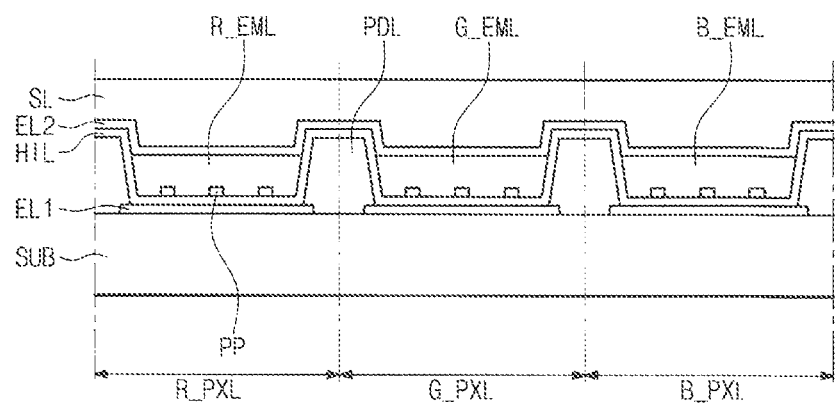

Referring to FIG. 5E, the second electrode EL2 is formed on the substrate SUB, on which the light emitting layer EML is formed, and the sealant layer SL is formed to cover the second electrode EL2, to thereby manufacture the organic light emitting display.

In the organic light emitting display having the above-mentioned structure, since the protrusion pattern is formed in the electron injection layer, the light emitting layer has the uniform thickness in the pixel area. In particular, the light emitting layer may be prevented from being increased in thickness due to the overlap between the light emitting layer and the pixel definition layer in the area located closer to the pixel definition layer. Accordingly, since the light emitting layer is formed to have uniform thickness in the whole area of the pixel areas, the dark spots are prevented or reduced. As a result, the uniformity of the image displayed in each pixel is improved, so that a life span of each pixel is extended.

In addition, although a relatively large amount of the organic light emitting material for the light emitting layer is provided in a specific pixel area, the organic light emitting material may be prevented from overflowing to the other pixel areas. Therefore, colors may be prevented from being mixed between the pixels adjacent to each other.

Figure 6:
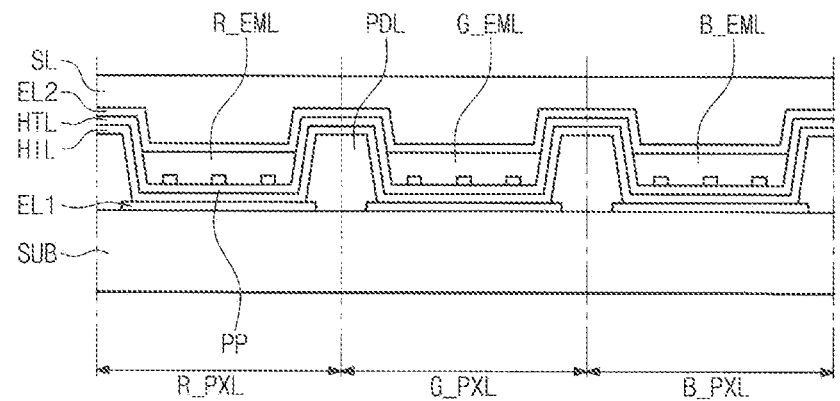
FIGS. 6 to 8 are cross-sectional views showing an organic light emitting display according to another exemplary embodiment of the present invention.

FIG. 6 is a cross-sectional view showing an organic light emitting display according to another exemplary embodiment of the present invention. In FIG. 6, the same reference numerals denote the same elements in FIG. 4, and thus detailed descriptions of the same elements will be omitted.

Referring to FIG. 6, a hole transport layer HTL is further disposed between the hole injection layer HIL and the light emitting layer EML as the lower common layer, and the protrusion pattern PP is disposed on the hole transport layer HTL.

The hole transport layer HTL includes a carbazole derivative of N-phenyl carbazole, polyvinyl carbazole, etc., or amine derivative including an aromatic condensed-ring compound of NPB, N,N'-bis(3-methylphenyl)-N,N'-diphenyl-[1,1-biphenyl]-4,4'-thiamine(TPD), N,N'-di(naphthalene-1-yl)-N,N'-diphenyl benzidine(α-NPD), etc. Among them, TCTA transports the hole and prevents the exciton from being dispersed from the light emitting layer EML.

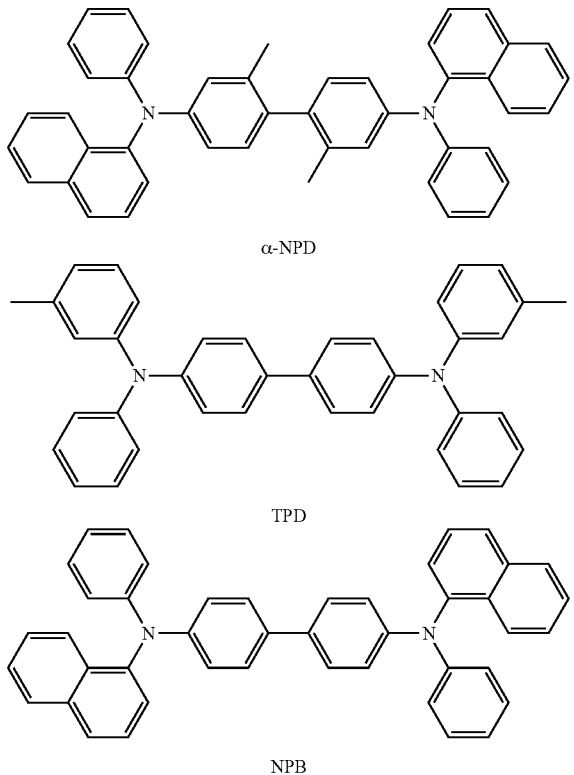

The hole transport layer HTL may be formed on the hole injection layer HIL using various methods, e.g., a slit coating method, a printing method, a vacuum deposition method, a spin coating method, a casting method, an LB method, etc.

The protrusion pattern PP is disposed on the hole transport layer HTL. The protrusion pattern PP is formed through the same method as those described with reference to FIGS. 5A to 5E.

Due to the protrusion pattern disposed on the hole transport layer, the light emitting layer has the uniform thickness in the whole area of the pixel area, and thus the dark spots are prevented or reduced. As a result, the uniformity of the image displayed in each pixel is improved. In addition, the light emitting layer may be prevented from overflowing to the adjacent pixel area.

Figure 7:
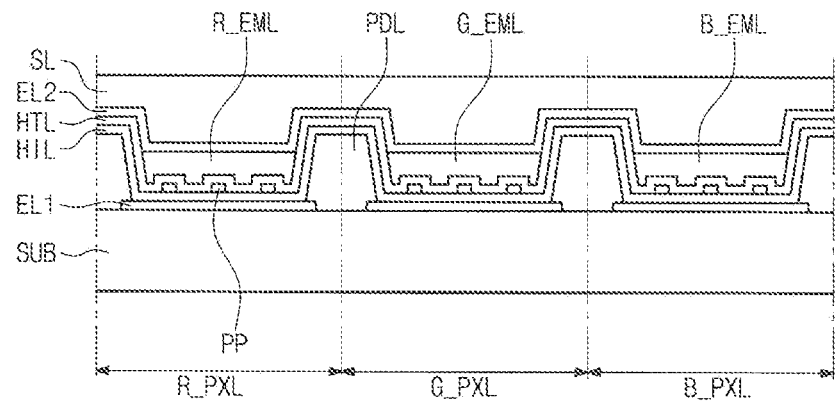

FIG. 7 is a cross-sectional view showing an organic light emitting display according to another exemplary embodiment of the present invention.

Referring to FIG. 7, the protrusion pattern PP is disposed on the hole injection layer HIL and the hole transport layer HTL is disposed between the hole injection layer HIL and the light emitting layer EML as the lower common layer.

The hole transport layer HTL is formed through the same material and method as those of the hole transport layer HTL described in the above exemplary embodiment. The hole transport layer HTL is formed along a surface of the hole injection layer HIL and a surface of the protrusion pattern PP disposed on the hole injection layer HIL, and thus portions of the hole transport layer HTL, which correspond to the protrusion pattern PP, are upwardly protruded.

The light emitting layer is formed on the hole transport layer including the protruded portions and has the uniform thickness in the pixel due to the protruded portions of the hole transport layer. In addition, the light emitting layer has the uniform thickness in the whole area of the pixel area, and thus the dark spots are prevented or reduced. As a result, the uniformity of the image displayed in each pixel is improved. In addition, the light emitting layer may be prevented from overflowing to the adjacent pixel area.

Here, the protrusion pattern is formed on the hole injection layer or the hole transport layer. In this case, when the light emitting layer is formed, the protrusions protruded from the upper surface of the substrate exist. In the case that the protrusion pattern is disposed under the hole injection layer, i.e., on the first electrode EL1 or on the lower elements under the first electrode EL1, a surface of the upper elements disposed on the first electrode EL1 is planarized, so that the protruded portions do not exist.

Figure 8:
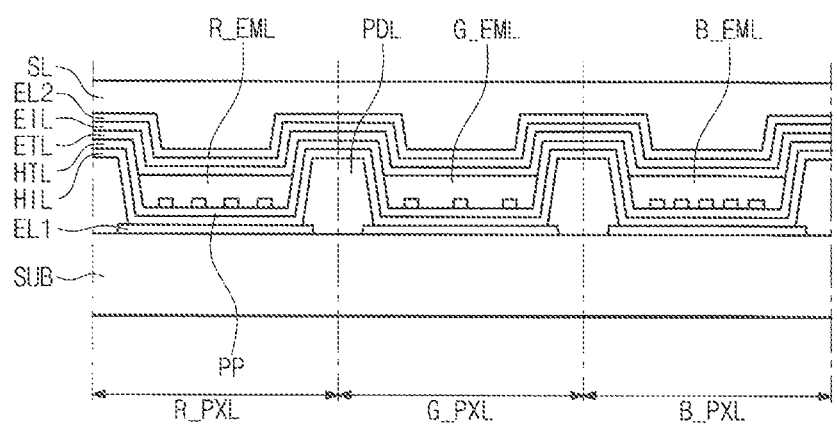

FIG. 8 is a cross-sectional view showing an organic light emitting display according to another exemplary embodiment of the present invention.

Referring to FIG. 8, the hole transport layer HTL is further disposed between the hole injection layer HIL and the light emitting layer EML as the lower common layer, and the protrusion pattern PP is disposed on the hole transport layer HTL. In addition, the electron injection layer EIL and the electron transport layer ETL are further disposed between the light emitting layer EML and the second electrode EL2.

In the present exemplary embodiment, the protrusion pattern PP may be provided in the same shape and the same number as those of a red color pixel R_PXL, a green color pixel G_PXL, and a blue color pixel B_PXL, but it should not be limited thereto or thereby. That is, the protrusion pattern PP may be provided in the different shapes and the same numbers from those of the red color pixel R_PXL, the green color pixel G_PXL, and the blue color pixel B_PXL. A red organic light emitting material, a green organic light emitting material, and a blue organic light emitting material respectively provided in the red color pixel R_PXL, the green color pixel G_PXL, and the blue color pixel B_PXL may have different viscosities or different surface tensions from each other. Accordingly, although the red, green, and blue organic light emitting materials are respectively provided in the red, green, and blue color pixels R_PXL, G_PXL, and B_PXL in the same amount, the thickness of the light emitting layer EML becomes different depending on the red, green, and blue color pixels R_PXL, G_PXL, and B_PXL. To prevent the thickness of the light emitting layer EML from becoming different, the protrusion pattern PP is provided in different shapes or different densities in accordance with the red, green, and blue color pixels R_PXL, G_PXL, and B_PXL, an thus the light emitting layer EML may have the uniform thickness regardless of the red, green, and blue color pixels R_PXL, G_PXL, and B_PXL. The shape and density of the protrusion pattern PP depends on the red, green, and blue organic light emitting materials. For instance, the number of the protrusion patterns PP disposed in the blue color pixel B_PXL may be greater than the number of the protrusion patterns PP disposed in the green color pixel G_PXL or the blue color pixel B_PXL.

The electron transport layer ETL is formed on the light emitting layer EML. The electron transport layer ETL includes a quinoline derivative, e.g., tris(8-quinolinolato)aluminum (Alq3), TAZ, Balq, etc, but it should not be limited thereto or thereby.

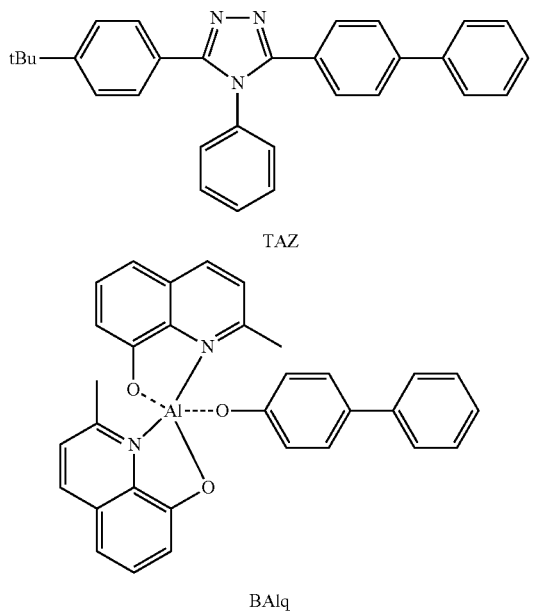

The electron transport layer ETL may be formed on the light emitting layer EML using various methods, e.g., a slit coating method, a printing method, a vacuum deposition method, a spin coating method, a casting method, an LB method, etc.

The electron injection layer EIL is formed on the electron transport layer ETL. The electron injection layer EIL includes a material, e.g., LiF, NaClC CsF, Li20, BaO, etc., and is formed on the electron transport layer ETL by using a deposition or coating method on the same deposition condition as the hole injection layer HIL.

In the present exemplary embodiment, due to the protrusion pattern disposed on the hole transport layer, the light emitting layer has the uniform thickness in the whole area of the pixel area, and thus the dark spots are prevented or reduced. As a result, the uniformity of the image displayed in each pixel is improved. In addition, the light emitting layer may be prevented from overflowing to the adjacent pixel area.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:
1. An organic light emitting display comprising:
   a substrate;
   a first electrode disposed on the substrate;
   a pixel definition layer disposed on the substrate which contains at least one pixel area;
   a first common layer disposed on the first electrode;
   a protrusion pattern, that includes a plurality of protrusions, disposed on the first common layer, the protrusions being spaced apart from each other;
   a light emitting layer disposed on the first common layer in the pixel area; and
   a second electrode disposed on the light emitting layer.
2. The organic light emitting display of claim 1, further comprising a second common layer disposed between the first common layer and the light emitting layer.
3. The organic light emitting display of claim 2, wherein the first common layer is a hole injection layer and the second common layer is a hole transport layer.
4. The organic light emitting display of claim 1, further comprising a second common layer disposed between the first electrode and the first common layer.
5. The organic light emitting display of claim 4, wherein the first common layer is a hole transport layer and the second common layer is a hole injection layer.
6. The organic light emitting display of claim 1, wherein the pixel definition layer is partitioned into a plurality of pixel areas.
7. The organic light emitting display of claim 6, wherein each of the pixel areas is a red pixel area, a green pixel area, or a blue pixel area, and the light emitting layer emits a red light, a green light, and a blue light in the red pixel area, the green pixel area, and the blue pixel area, respectively.
8. The organic light emitting display of claim 7, wherein the protrusion pattern provided in each of the red, green, and blue pixel areas respectively have different shapes or different densities.
9. The organic light emitting display of claim 1, further comprising at least one of an electron injection layer or an electron transport layer, which is disposed between the light emitting layer and the second electrode.
10. A method of manufacturing an organic light emitting display, comprising:
    forming a first electrode on a substrate;
    forming a pixel definition layer on the first electrode which contains at least one a pixel area;
    forming a first common layer on the first electrode;
    forming a protrusion pattern including a plurality of protrusions spaced apart from each other on the first common layer;
    forming a light emitting layer on the first common layer in the pixel area; and
    forming a second electrode on the light emitting layer.
11. The method of claim 10, wherein the light emitting layer is formed by an inkjet.
12. The method of claim 11, wherein the forming of the protrusion pattern comprises:
    forming a photosensitive organic layer on the first common layer; and
    selectively irradiating light onto the photosensitive organic layer using a mask to form the protrusion pattern.
13. The method of claim 12, further comprising forming a second common layer on the first common layer before the light emitting layer is formed.

14. The method of claim 13, wherein the first common layer is a hole injection layer and the second common layer is a hole transport layer.

15. The method of claim 12, further comprising forming a second common layer on the first electrode before the first common layer is formed.

16. The method of claim 15, wherein the first common layer is a hole transport layer and the second common layer is a hole injection layer.

17. The method of claim 12, wherein the pixel definition layer contains plurality of pixel areas.

18. The method of claim 17, wherein each of the pixel areas is one of a red pixel area, a green pixel area, or a blue pixel area, and the forming of the light emitting layer comprises:

forming a red light emitting layer in the red pixel area;
   forming a green light emitting layer in the green pixel area; and
   forming a blue light emitting layer in the blue pixel area.

19. The method of claim 18, wherein the protrusion pattern provided in the red, green, and blue pixel areas has different shapes or different densities.

20. The method of claim 10, further comprising forming at least one of an electron injection layer or an electron transport layer between the light emitting layer and the second electrode.

* * * * *